US012589462B2

(12) United States Patent
Huang

(10) Patent No.: US 12,589,462 B2
(45) Date of Patent: Mar. 31, 2026

(54) APPARATUS AND METHOD FOR MANUFACTURING SEMICONDUCTOR STRUCTURE

(71) Applicant: TAIWAN SEMICONDUCTOR MANUFACTURING COMPANY LTD., Hsinchu (TW)

(72) Inventor: Chun-Hsi Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 800 days.

(21) Appl. No.: 17/824,930

(22) Filed: May 26, 2022

(65) Prior Publication Data

US 2023/0381914 A1 Nov. 30, 2023

(51) Int. Cl.
*B24B 37/04* (2012.01)
*B24B 37/015* (2012.01)
*H01L 21/306* (2006.01)
*H01L 21/66* (2006.01)

(52) U.S. Cl.
CPC .......... *B24B 37/042* (2013.01); *B24B 37/015* (2013.01); *H01L 21/30625* (2013.01); *H01L 22/20* (2013.01)

(58) Field of Classification Search
None
See application file for complete search history.

(56) References Cited

U.S. PATENT DOCUMENTS

| | | | |
|---|---|---|---|
| 2017/0239778 A1* | 8/2017 | Maruyama | B24B 37/20 |
| 2019/0030675 A1* | 1/2019 | Chen | B24B 37/015 |
| 2024/0181594 A1* | 6/2024 | Kabasawa | B24B 37/005 |

* cited by examiner

*Primary Examiner* — Feifei Yeung Lopez
(74) *Attorney, Agent, or Firm* — WPAT LAW; Anthony King

(57) ABSTRACT

An apparatus and a method for forming a semiconductor structure are provided. The apparatus includes a polishing pad, a polishing head and a temperature control module. The polishing head mounts a substrate against the polishing pad. The temperature control module faces the polishing pad. The temperature control module includes a first temperature controller and a second temperature controller. The first temperature controller is configured to control a first temperature of a first zone of the polishing pad. The second temperature controller is configured to control a second temperature of a second zone of the polishing pad.

20 Claims, 12 Drawing Sheets

Receiving a substrate ~402

Mounting the substrate to a polishing head with a side of the substrate facing a polishing pad ~404

Measuring a temperature distribution of the polishing pad ~406

Adjusting the temperature distribution of the polishing pad through a temperature control module, wherein the temperature control module faces the polishing pad ~408

400

APPARATUS AND METHOD FOR MANUFACTURING SEMICONDUCTOR STRUCTURE

BACKGROUND

The semiconductor integrated circuit (IC) industry has experienced exponential growth over the last few decades. As a result of IC evolution, functional density (i.e., number of interconnected devices per chip area) has generally increased while geometry size (i.e., size of a smallest component (or line) that can be created using a fabrication process) has decreased. Such continuing reduction in device size and increasingly complicated circuit designs have made design and fabrication of the ICs more challenging and costly. For producing semiconductor IC components with desirable dimensions, polishing techniques, such as chemical mechanical polishing (CMP), have been widely used. CMP has been used to remove unwanted material from semiconductor wafer surfaces between and during operations of manufacturing semiconductor wafers. However, uniform polishing is difficult to achieve due to various factors.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
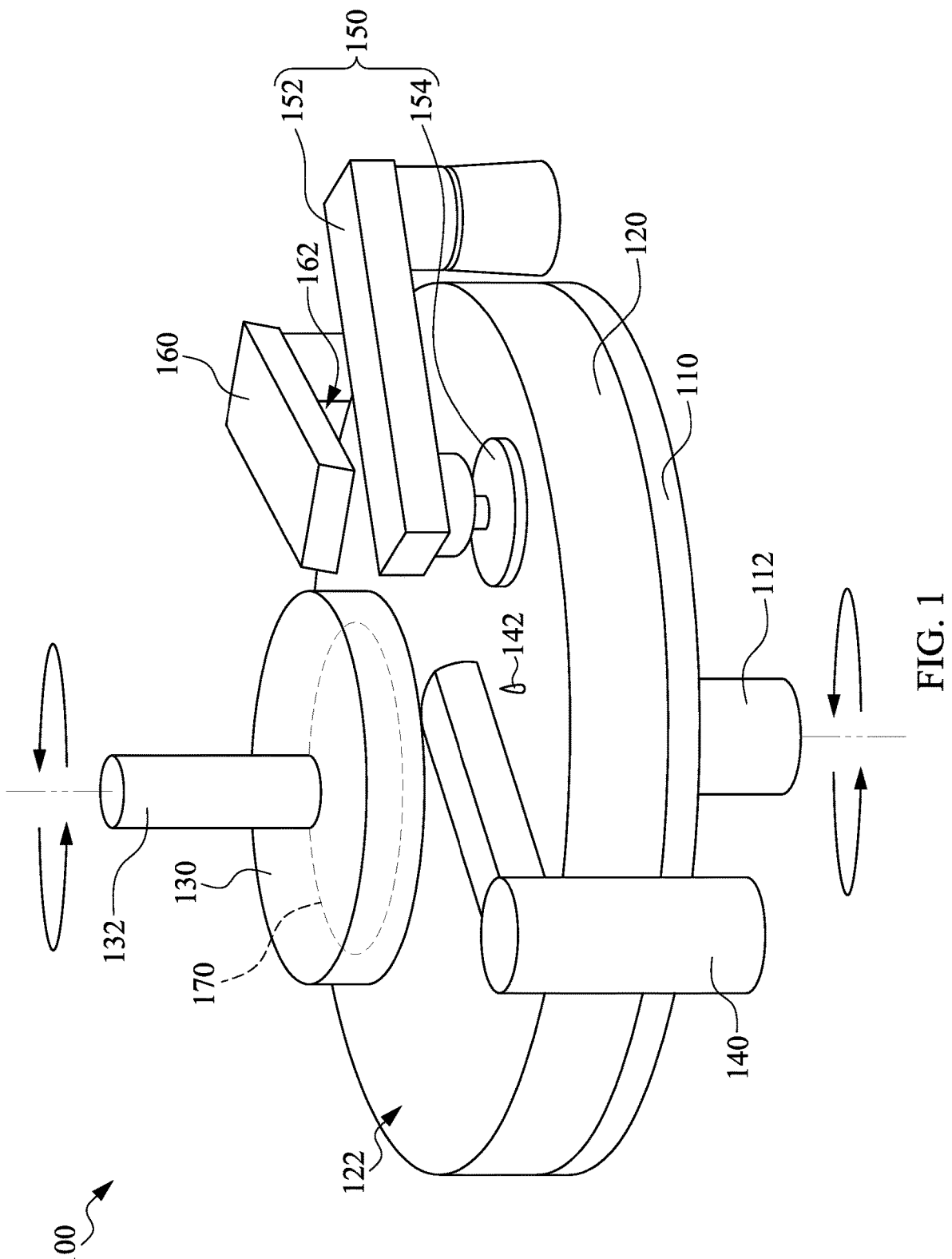
FIG. 1 is a schematic view of an apparatus for manufacturing a semiconductor structure according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. It should be appreciated that the following figures are not drawn to scale; rather, these figures are merely intended for illustration.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially, relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Integrated circuits are chemically and physically integrated into a substrate by patterning regions in the substrate and layers on the substrate. The layers are generally formed of various materials having either a conductive, insulating or semiconducting nature. In order for a device to have high yields, it is crucial to start with a flat semiconductor wafer and, as a result, it is often necessary to polish a side or a part of a semiconductor wafer. A chemical mechanical polishing ("CMP") operation has been used to planarize a surface of the wafer during various stages of device fabrication in order to ensure wafer surface planarity and improve yield, performance and reliability. The CMP generally involves a hybrid of chemical etching and physical (abrasive) polishing, and thus is performed using a combination of chemical and mechanical forces. For example, the CMP operation uses a slurry including abrasives in conjunction with a polishing pad. The polishing pad and the wafer are pressed together by a polishing head. The polishing head may be rotated to remove material and tends to smooth any irregular topography on the wafer, making the wafer surface flat or planar. This flat or planar surface may facilitate formation of components thereon. As the integrated circuits need to integrate various devices, greater challenge for the CMP operation arise. Different devices have different materials, structures and feature densities on the wafer surface to be polished, which pose difficulties in achieving uniform control of the CMP.

Some embodiments of the present disclosure provide an apparatus and a method for forming a semiconductor structure that provides one or more improvements over existing approaches. The present disclosure provides an apparatus that integrates a temperature control module. By integrating the temperature control module in a CMP apparatus as described below, a temperature distribution of a polishing pad may be controlled. With control of the temperature distribution of the polishing pad, a surface profile (i.e., a thickness profile) of a wafer may be improved and a uniformly polished surface may be obtained. In addition, a lifetime of the polishing pad may be extended by the control of the temperature distribution of the polishing pad.

Figure 2:
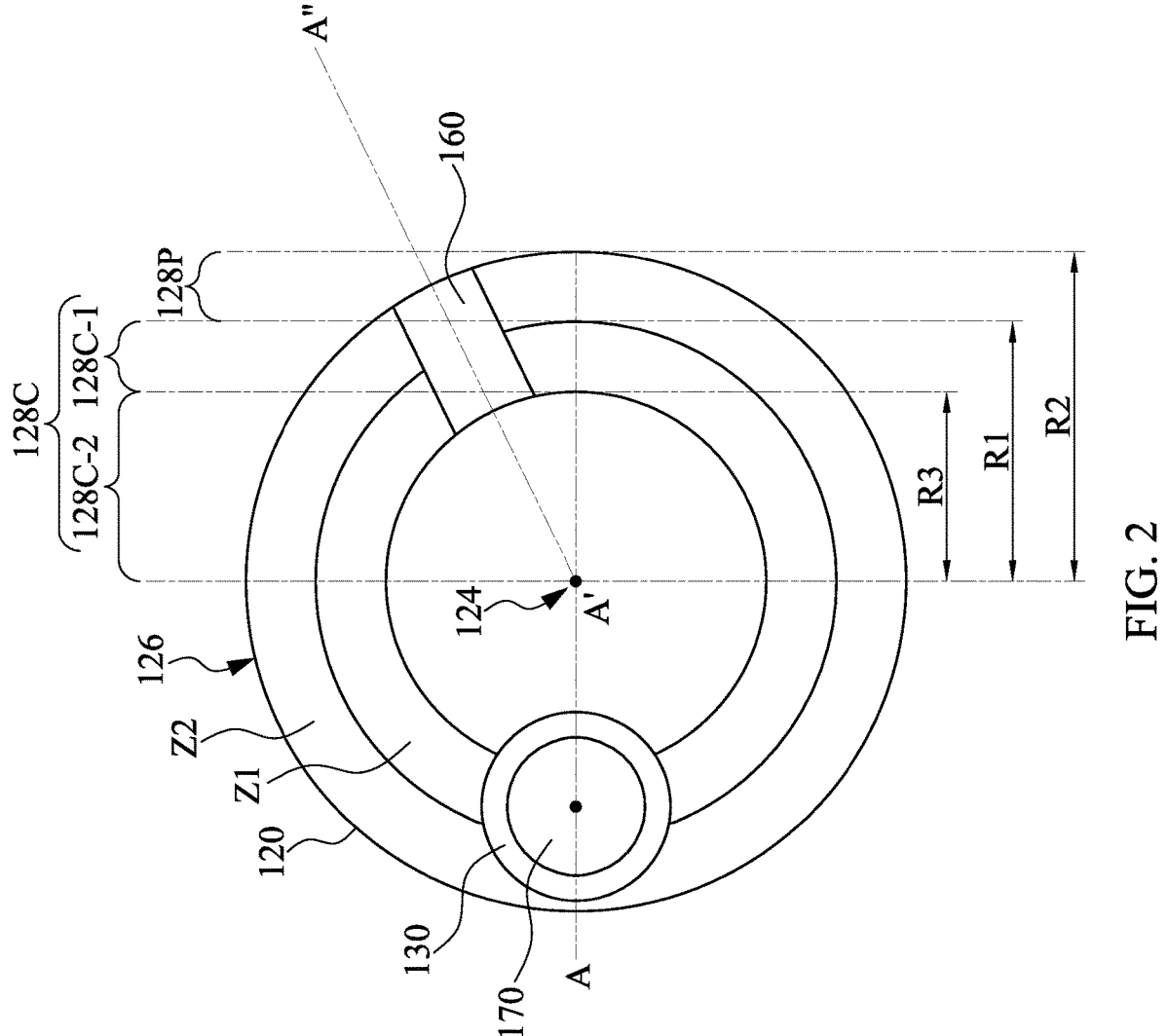
FIG. 2 is a top view of an apparatus for manufacturing a semiconductor structure according to aspects of one or more embodiments of the present disclosure.
Figure 3:
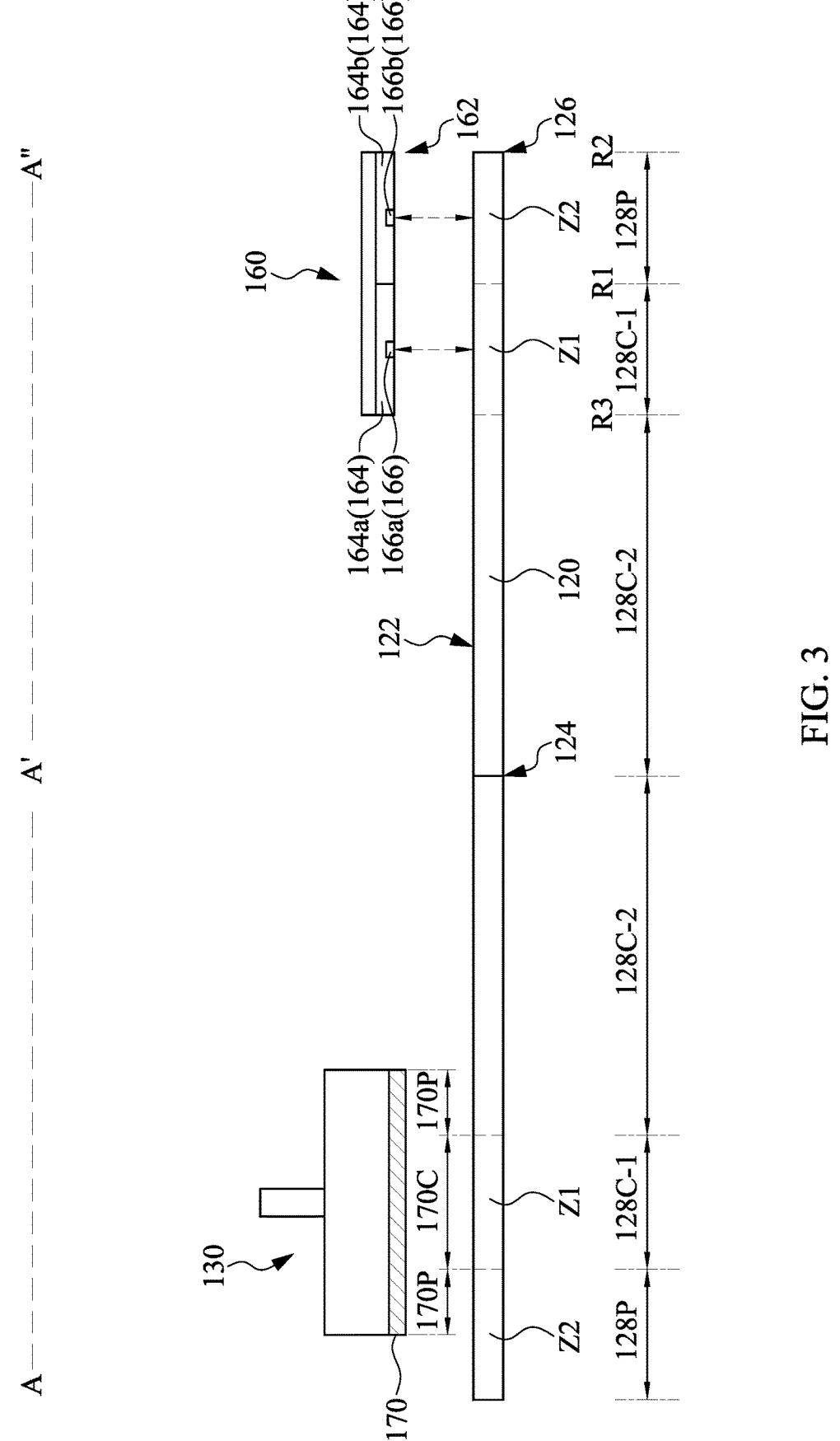
FIG. 3 is a cross-sectional view of the apparatus taken along line A-A'-A" of FIG. 2 according to aspects of one or more embodiments of the present disclosure.

FIG. 1 is a schematic view of an apparatus 100 for manufacturing a semiconductor structure according to aspects of one or more embodiments of the present disclosure. FIG. 2 is a top view of the apparatus 100 according to aspects of one or more embodiments of the present disclosure. FIG. 3 is a cross-sectional view of the apparatus 100 taken along a line A-A'-A" of FIG. 2 according to aspects of one or more embodiments of the present disclosure. In some embodiments, the apparatus 100 includes a pedestal 110, a polishing pad 120, a polishing head 130, a slurry introduction device 140, a pad conditioner 150, and a temperature control module 160. In some embodiments, the apparatus 100 is configured to perform one or more polishing operations on one or more substrates 170. For example, the substrate 170 may be subjected to one or more chemical mechanical polishing operations via the apparatus 100. For the sake of clarity, only the polishing pad 120, the polishing head 130, the temperature control module 160, and the substrate 170 are illustrated in FIGS. 2 and 3. In some embodiments, a point A' corresponds to a center 124 of the polishing pad 120.

In some embodiments, the substrate 170 may be a wafer that includes one or more semiconductor layer(s), conductor(s), and/or insulator layer(s). The semiconductor layer(s) may, include an elementary semiconductor such as silicon or germanium with a crystalline, polycrystalline, amorphous, and/or other suitable structure; a compound semiconductor including silicon carbide, gallium arsenic, gallium phosphide, indium phosphide, indium arsenide, and/or indium antimonide; an alloy semiconductor including SiGe, GaAsP, Minas, AlGaAs, GaInAs, GaInP, and/or GaInAsP; any other suitable material; and/or combinations thereof. In some embodiments, combinations of semiconductors may take a form of a mixture or a gradient such as a wafer in which a ratio of Si and Ge vary across locations. In some embodiments, the substrate 170 includes layered semiconductors. For example, the layered semiconductors may be disposed on an insulator to produce a silicon-on-insulator (SOI) wafer, a silicon-on-sapphire wafer, or a silicon-germanium-on-insulator wafer. Alternatively, the layered semiconductors may be disposed on a glass to produce a thin film transistor (TFT).

In some embodiments, the substrate 170 may be a wafer that is subjected to various stages of device fabrication. For example, the substrate 170 may be a wafer that includes one or more individual devices (e.g., transistors, capacitors, resistors, etc.) that are formed in a front-end-of-line (FEOL) stage of device fabrication. Alternatively, the substrate 170 may be a wafer that includes one or more interconnects (e.g., conductive lines, conductive vias, etc.) that are formed in a back-end-of-line (BEOL) stage of device fabrication. In some embodiments, such stages of device fabrication result in an irregular top surface topography of the substrate 170, with bumps, areas of unequal elevation, troughs, trenches and other similar types of surface irregularities. The apparatus 100 may be used to ensure global planarization of such surfaces to remove irregularities and surface imperfections during various stages of the fabrication process.

In some embodiments, the pedestal 110 and the polishing pad 120 are together referred to as a polishing wheel assembly. The pedestal 110 may be used to accommodate the polishing pad 120. The pedestal 110 may be coupled to a spindle (or a shaft) 112. The spindle 112 is operable to be rotated by a motor or any other suitable driving mechanism. The polishing pad 120 is arranged on the pedestal 110 and is configured to be rotated by the spindle 112. The polishing pad 120 is attached to the pedestal 110, and thus is able to be rotated along with the pedestal 110. In some embodiments, the polishing pad 120 includes a polishing surface 122 facing the polishing head 130, the slurry introduction device 140, the pad conditioner 150, and the temperature control module 160. The polishing pad 120 may be made of harder materials that provide high removal rates and have long useful pad life. Alternatively, the polishing pad 120 may, be made of softer materials that provide less scratching on substrates (e.g., the substrate 170) being polished. In some embodiments, asperities may be randomly distributed on the polishing pad 120. In some embodiments, the random asperities on the polishing pad 120 may approach a uniform net removal effect because a same amount of removal occurs in each location of the substrate 170 to be polished.

The polishing head 130 (sometimes also referred to as a substrate carrier) is arranged over the polishing pad 120, and is configured to support and rotate a workpiece, such as the substrate 170. The polishing head 130 is mounted on a carrier assembly (not shown). The polishing head 130 may be configured to hold or grip the substrate 170. The polishing head 130 is coupled to another spindle (or a shaft) 132. The spindle 132 is operable to be rotated by a motor or any other suitable driving mechanism. The rotation of the polishing head 130 and the rotation of the polishing pad 120 may be independently controlled. The rotational direction of the polishing head 130 or the rotational direction of the polish- ing pad 120 may be clockwise or counterclockwise. In some embodiments, the apparatus 100 further includes a retainer ring (not shown) for retaining the substrate 170 to be polished. The retainer ring is operable to prevent the sub- strate 170 from sliding out from under the polishing head 130 as the polishing head 130 moves. In general, a CMP operation involves a circular motion of a substrate (e.g., the substrate 170) under a controlled downward pressure with the polishing pad 120 saturated with a polishing slurry 142.

The slurry introduction device 140 may include one or more nozzles (not shown) arranged over the polishing pad 120, and may be configured to introduce polishing slurry 142 to the polishing pad 120 through the nozzle(s) (not shown). In some embodiments, the polishing slurry 142 includes chemical and abrasive components. The polishing slurry 142 may include abrasives to provide mechanical polishing forces, and may include chemicals such as oxi- dizer to react with a material on the substrate 170 to be polished. A composition of the polishing slurry 142 may be an important factor in the CMP operation. The composition of the polishing slurry 142 may be selected depending on the material of the substrate 170 or an overlying film to be polished. For example, various types of the polishing slurry 142 may be used for polishing oxide, metal, and poly-silicon according to a type of object to be polished. Depending on additives included in the polishing slurry 142, such as oxidizing agents, the abrasive, and other additives, the polishing slurry 142 may be tailored to provide effective polishing to metal layers at desired polishing rates while minimizing surface imperfections, defects, corrosion, and erosion. Furthermore, the polishing slurry 142 may be used to provide controlled polishing selectivities to other thin- film materials used in the substrate 170, such as titanium, titanium nitride and the like.

The pad conditioner 150 may be configured to condition the polishing surface 122 of the polishing pad 120. The pad conditioner 150 includes an arm 152 and a disk 154, The arm 152 is coupled to the disk 154. The disk 154 is a polishing disk for performing pad dressing or pad conditioning. In some embodiments, the arm 152 is configured to exert a downward force against the disk 154. The arm 152 may be configured to move the disk 154 over and across the pol- ishing surface 122 of the polishing pad 120.

The temperature control module 160 may be configured to control temperatures of different regions of the polishing pad 120, Referring to FIG. 3, the temperature control module 160 has a surface 162 facing the polishing surface 122 of the polishing pad 120. The position of the temperature control module 160 may be altered according to different imple- mentations. As shown in FIG. 1, in some embodiments, the temperature control module 160 is mounted between the polishing head 130 and the pad conditioner 150, In some alternative embodiments, the temperature control module 160 is mounted between the polishing head 130 and the slurry introduction device 140. Alternatively or additionally, the temperature control module 160 is mounted between the slurry introduction device 140 and the pad conditioner 150.

In some embodiments, the temperature control module 160 includes one or more temperature controllers 164. The temperature controller 164 may include a heating element and/or a cooling element. In some embodiments, the heating element and/or the cooling element may include a blower, a fan, an infrared (IR) heater, or other suitable elements. A number of the temperature controllers 164 may be altered according to different implementations. As shown in FIG. 3, in some embodiments, the temperature control module 160 includes a first temperature controller 164a and a second temperature controller 164b. The first temperature controller 164a may be configured to control a temperature of a first zone Z1 of the polishing pad 120. The second temperature controller 164b may be configured to control a temperature of a second zone Z2 of the polishing pad 120.

In some embodiments, the temperature control module 160 includes one or more temperature sensors 166. A number of the temperature sensors 166 may be altered according to different implementations. As shown in FIG. 3, in some embodiments, the temperature control module 160 includes a first temperature sensor 166a and a second temperature sensor 166b. The first temperature sensor 166a may be configured to detect the temperature of the first zone Z1 of the polishing pad 120. The second temperature sensor 166b may be configured to detect the temperature of the second zone Z2 of the polishing pad 120.

The first zone Z1 and the second zone Z2 may be identified on the polishing surface 122 of the polishing pad 120 along a radial direction of the polishing pad 120. In some embodiments, the first zone Z1 is located near a center 124 of the polishing pad 120, while the second zone Z2 is located near a perimeter 126 of the polishing pad 120. As shown in FIGS. 2 and 3, a center region 128C of the polishing pad 120 is a circular region centered at the center 124 of the polishing pad 120 and having a radius R1. In some embodiments, a peripheral region 128P is a ring- shaped region having an inner edge forming a circle having a radius equal to the radius R1 and an outer edge forming a circle having a radius equal to a second radius R2. The second radius R2 may correspond to a radius of the polishing pad 120. In some embodiments, an outer portion 128C-1 of the center region 128C is separated from an inner portion 128C-2 of the center region 128C by a circle having a radius equal to a third radius R3. In some embodiments, the first zone Z1 corresponds to the center region 128C of the polishing pad 120, while the second zone Z2 corresponds to the peripheral region 128P of the polishing pad 120. Alter- natively or additionally, the first zone Z1 corresponds to the outer portion 128C-1 of the center region 128C of the polishing pad 120, while the second zone Z2 corresponds to the peripheral region 128P of the polishing pad 120. In some embodiments, a difference between the first radius R1 and the third radius R3 is substantially equal to a difference between the second radius R2 and the first radius R1.

Figure 4:
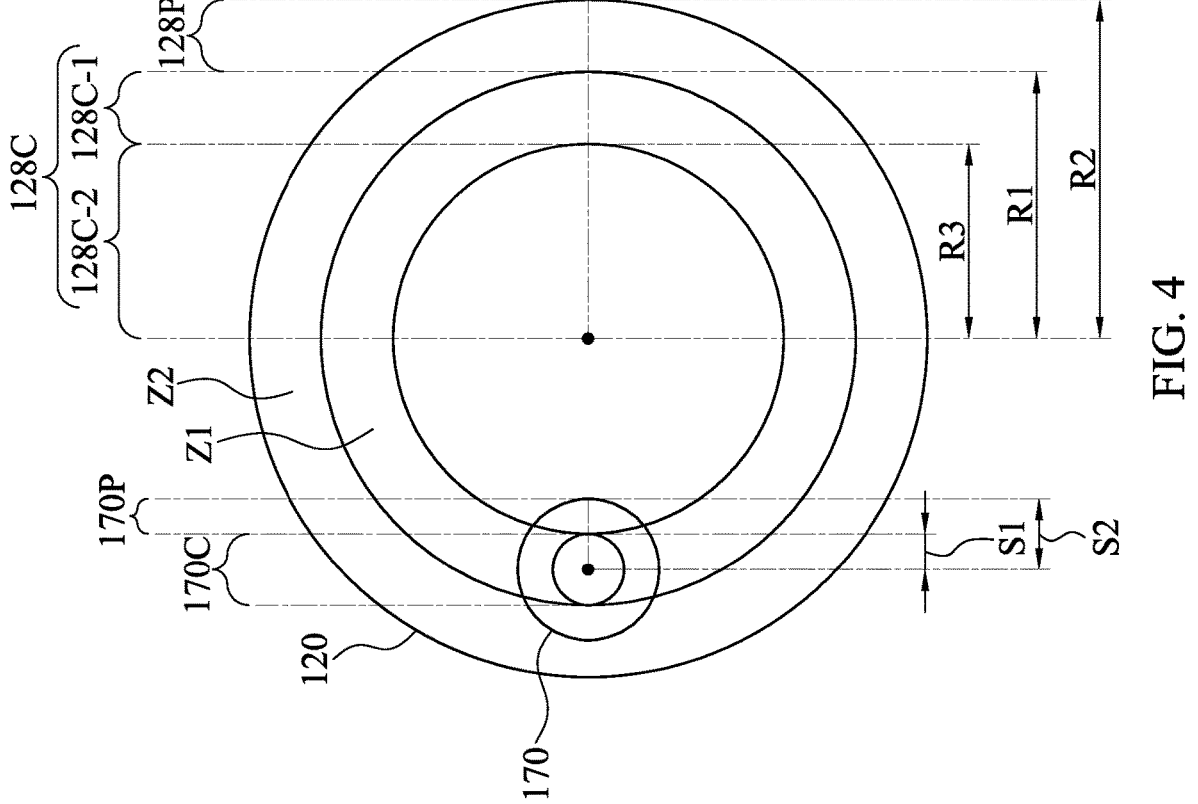
FIG. 4 is a top view of an apparatus for manufacturing a semiconductor structure according to aspects of one or more embodiments of the present disclosure.

FIG. 4 is a top view of the apparatus 100 according to aspects of one or more embodiments of the present disclo- sure. For the sake of clarity, only the polishing pad 120 and the substrate 170 are illustrated in FIG. 4. In some embodiments, one or more zones may be identified on a to-be polished surface of the substrate 170 along a radial direction of the substrate 170. As shown in FIGS. 3 and 4, a center region 170C of the substrate 170 is a circular region centered at a center of the substrate 170 and having a radius S1. In some embodiments, a peripheral region 170P is a ring-shaped region having an inner edge forming a circle with the radius S1 and an outer edge forming a circle with a radius S2. The radius S2 may correspond to a radius of the substrate 170. In some embodiments, the first zone Z1 of the polishing pad 120 corresponds to the center region 170C of the substrate 170, while the second zone Z2 of the polishing pad 120 corresponds to the peripheral region 170P of the substrate 170.

The first temperature controller 164a may be configured to raise or lower a number of removal events at the center region 1700 of the substrate 170 via the temperature control of the first zone Z1 of the polishing pad 120. The second temperature controller 164b may be configured to raise or lower a number of removal events at the peripheral region 170P of the substrate 170 via the temperature control of the second zone Z2 of the polishing pad 120. In some alternative embodiments, both the first temperature controller 164a and the second temperature controller 164b are activated. For example, after the substrate 170 is disposed over the polishing surface 122 and under the polishing head 130, both the first temperature controller 164a and the second temperature controller 164b are activated. In some alternative embodiments, only one of the first temperature controller 164a and the second temperature controller 164b is activated. For example, after the substrate 170 is disposed over the polishing surface 122 and under the polishing head 130, the first temperature controller 164a is turned off while the second temperature controller 164a is activated. People having ordinary skill in the art can appreciate that control of the first temperature controller 164a and control of the second temperature controller 164b are programmable and are determined according to topography information of the substrate 170 that is inputted to the temperature control module 160.

Figure 5:
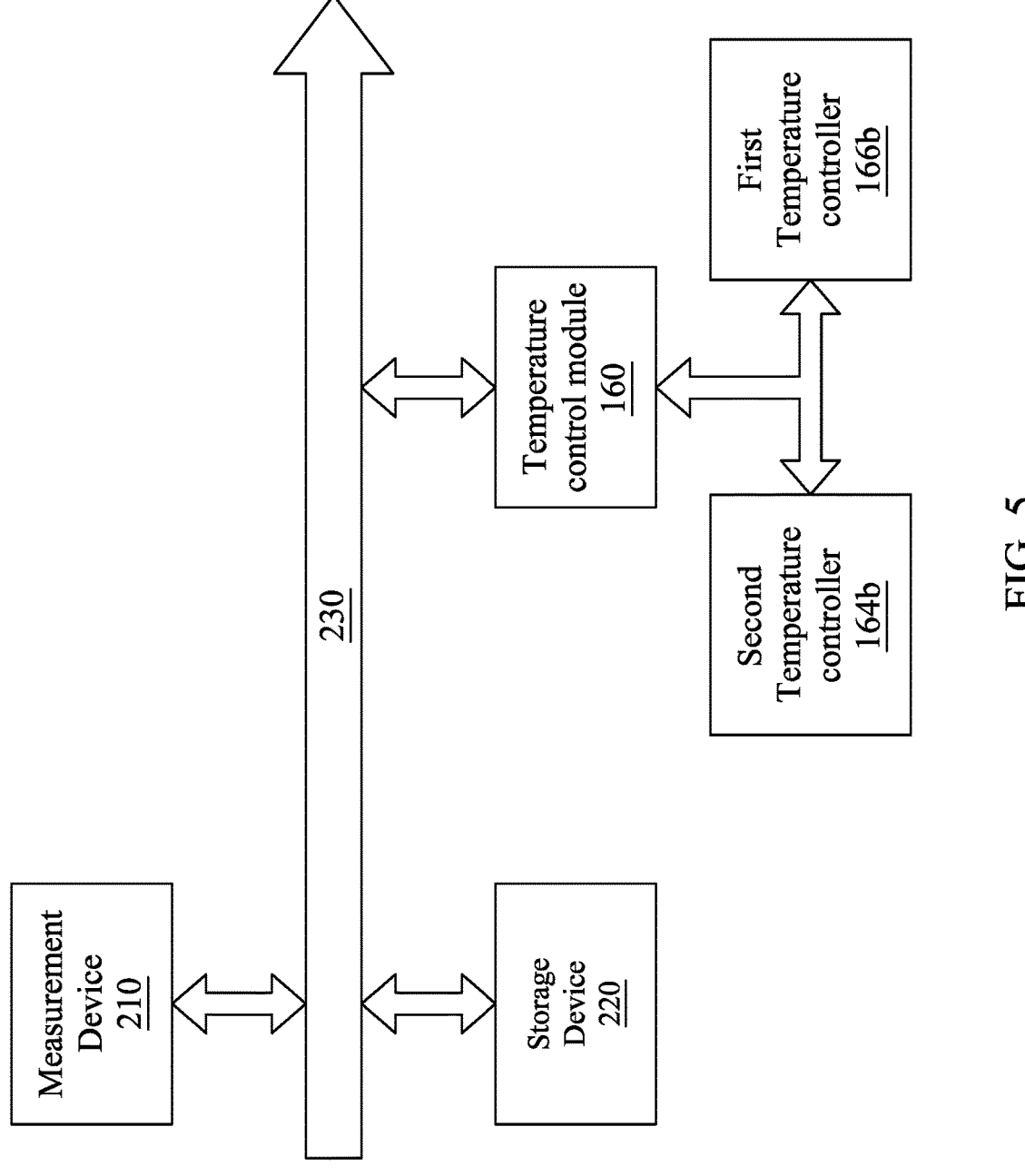
FIG. 5 is a block diagram showing a controlling system of the apparatus according to aspects of one or more embodiments of the present disclosure.

Referring to FIG. 5, FIG. 5 is a block diagram showing a controlling system 200 of the apparatus 100 according to aspects of one or more embodiments of the present disclosure. The controlling system 200 may include the temperature control module 160, a measurement device 210 and a storage device 220. The temperature control module 160, the measurement device 210 and the storage device 220 communicate with each other through a bus 230. In some embodiments, when a substrate 170 is to be placed over the apparatus 100 for planarization, a surface topography of the substrate 170 is measured by the measurement device 210. The measurement device 210 may be disposed in a polishing wheel assembly. In some embodiments, the measurement device 210 may be coupled to an analysis unit, such as a real-time surface profile analysis module. Alternatively, the measurement device 210 may be independent from the apparatus 100 or the controlling system 200 and the topography information may be transferred through other means. In such embodiments, the topography information is stored in the storage device 220, and indicates a first region of the substrate 170 or a die on the substrate 170 that requires additional removal events (i.e., additional polishing) and a second region of the substrate 170 or a die on the substrate 170 that requires fewer removal events (i.e., less polishing).

The classification could be more sophisticated such that more than two regions may be identified according to different precision needs.

After receiving the topography information from the storage device 220 through the bus 230, the temperature control module 160 outputs instructions to the first temperature controller 164a and/or the second temperature controller 164h. A temperature distribution of the polishing pad 120 is altered by the temperature control module 160. The temperature distribution of the polishing pad 120 is altered according to the topography information (or the surface profile) of the substrate 170 to be processed. A detailed description of the instructions provided by the temperature control module 160 is provided below with reference to FIGS. 6 to 7.

Figure 6:
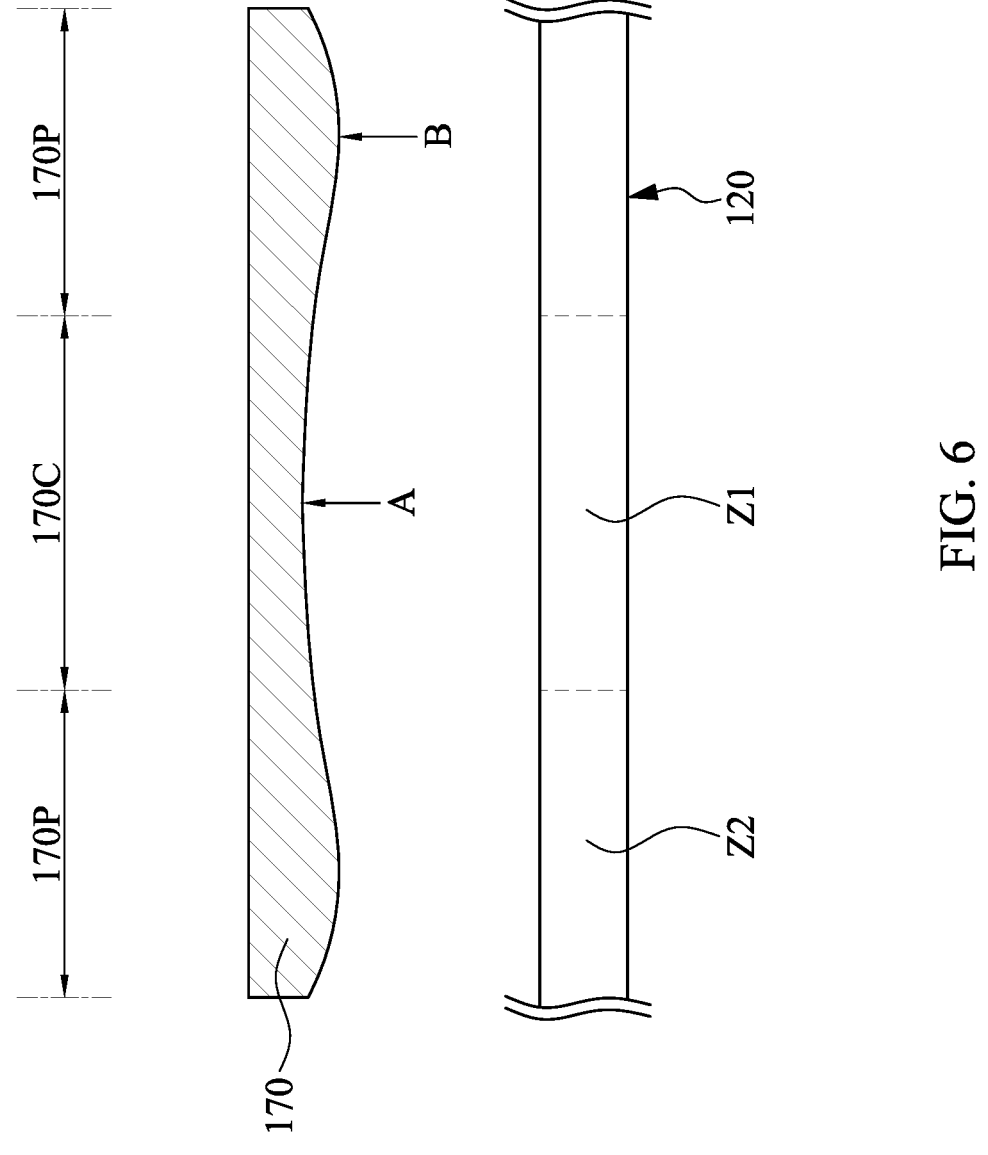
FIG. 6 is a cross-sectional view showing a method for using the apparatus according to aspects of one or more embodiments of the present disclosure.

In some embodiments, inherent defects in a substrate profile, for example, wafer dishing, may be exacerbated by earlier stages of device fabrication (e.g., a BEM stage of device fabrication). To planarize a dished substrate (e.g., the substrate 170), more removal events may be required at an edge of the substrate, where a surface of the substrate protrudes outward, than at a center of the substrate, where the surface of the substrate is dished. FIG. 6 is a cross-sectional view showing a method for using the apparatus 100 according to aspects of one or more embodiments of the present disclosure. FIG. 6 shows an enlarged view of a surface of the substrate 170 to be polished. The surface has an uneven surface topography including a recess A in a center region 170C and a protrusion B in a peripheral region 170P. A temperature distribution of the polishing pad 120 is altered according to a topography information (or a surface profile) of the substrate 170 to be processed. A second temperature of a second zone Z2 may be increased to raise a number of removal events at the B protrusion. Hence, the peripheral region 170P of the substrate 170 is subjected to more removal events than the center region 170C of the substrate 170. In some embodiments, when the second temperature of the second zone Z2 is increased, a first temperature of a first zone Z1 is kept unchanged. In some embodiments, the second temperature is greater than the first temperature. In some embodiments, the second temperature is greater than room temperature. Alternatively, the first temperature of the first zone Z1 may be decreased to reduce the number of removal events at the recess A. Hence, the center region 170C of the substrate 170 is subjected to fewer removal events than the peripheral region 170P of the substrate 170. In some embodiments, the first temperature is less than room temperature.

Figure 7:
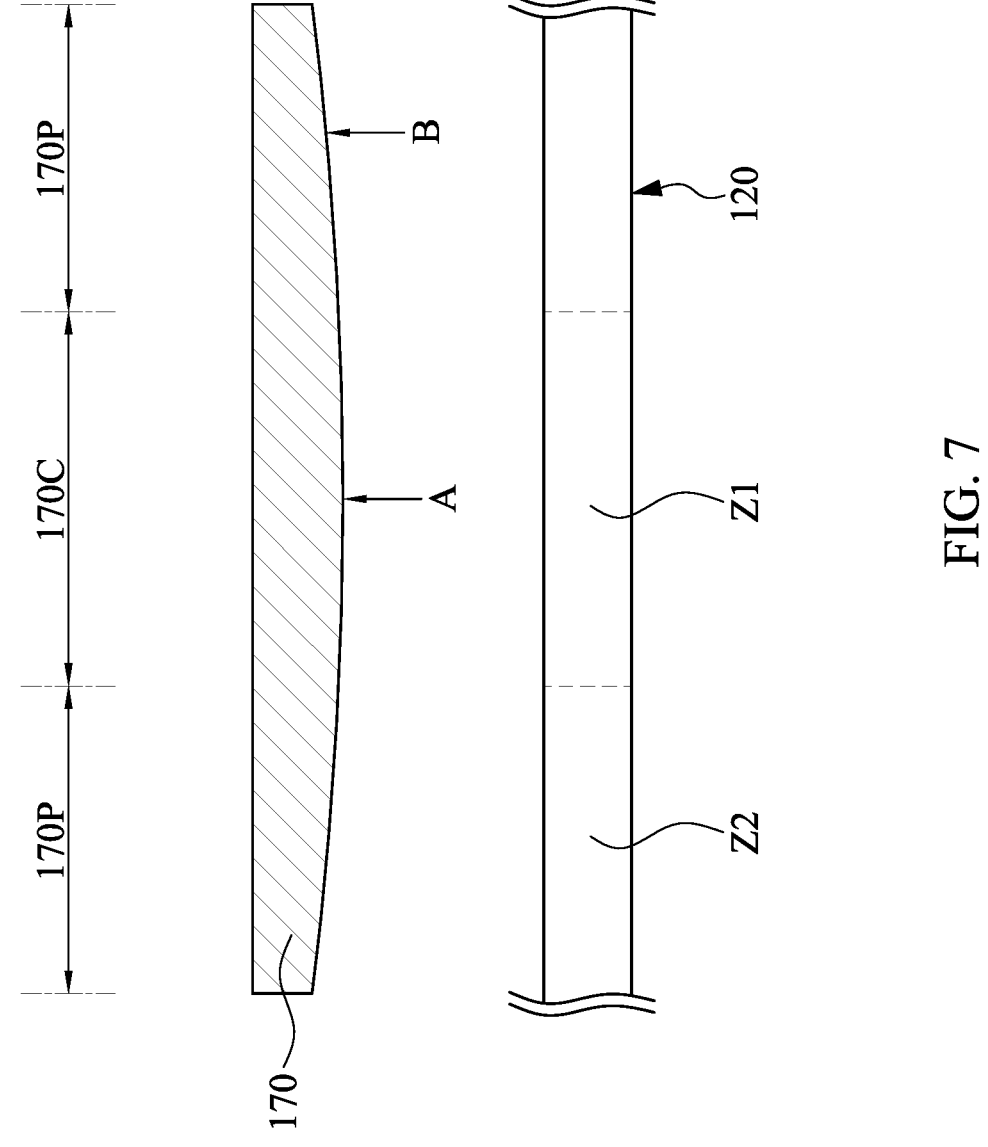
FIG. 7 is a cross-sectional view showing a method for using the apparatus according to aspects of one or more embodiments of the present disclosure.

In some alternative embodiments, in an enclosed region of a die pattern on a wafer, a first location in the die pattern may require more removal events while a second location in the die pattern may require fewer removal events. FIG. 7 is a cross-sectional view showing a method for using the apparatus 100, according to aspects of one or more embodiments of the present disclosure. FIG. 7 shows an enlarged view of a surface of the substrate 170 to be polished. The surface includes an uneven surface topography having a protrusion A in the center region 170C and a recess B in the peripheral region 170P. A temperature distribution of the polishing pad 120 is altered according to a topography information of the substrate 170 to be processed. A first temperature of a first zone Z1 may be increased to raise a number of removal events at the protrusion A. Alternatively, a second temperature of a second zone Z2 may be decreased to reduce a number of removal events at the recess B.

The present disclosure provides embodiments of an apparatus 100 for manufacturing a semiconductor structure that provide one or more improvements over existing approaches. The apparatus 100 includes a temperature control module 160. By integrating the temperature control module 160 in the apparatus 100 as described above, a temperature distribution of the polishing pad 120 may be controlled. With the control of the temperature distribution of the polishing pad 120 a surface profile of the substrate 170 may be improved and a uniformly polished surface may be obtained.

The structures of the present disclosure are not limited to the above-mentioned embodiments and may have other different embodiments. To simplify the description and for convenience of comparison between various embodiments of the present disclosure, identical (or like) components in each of the following embodiments are marked with identical (or like) numerals. For making it easier to compare differences between the embodiments, the following description will detail differences among different embodiments, while identical features, values and definitions will not be repeated.

Figure 8:
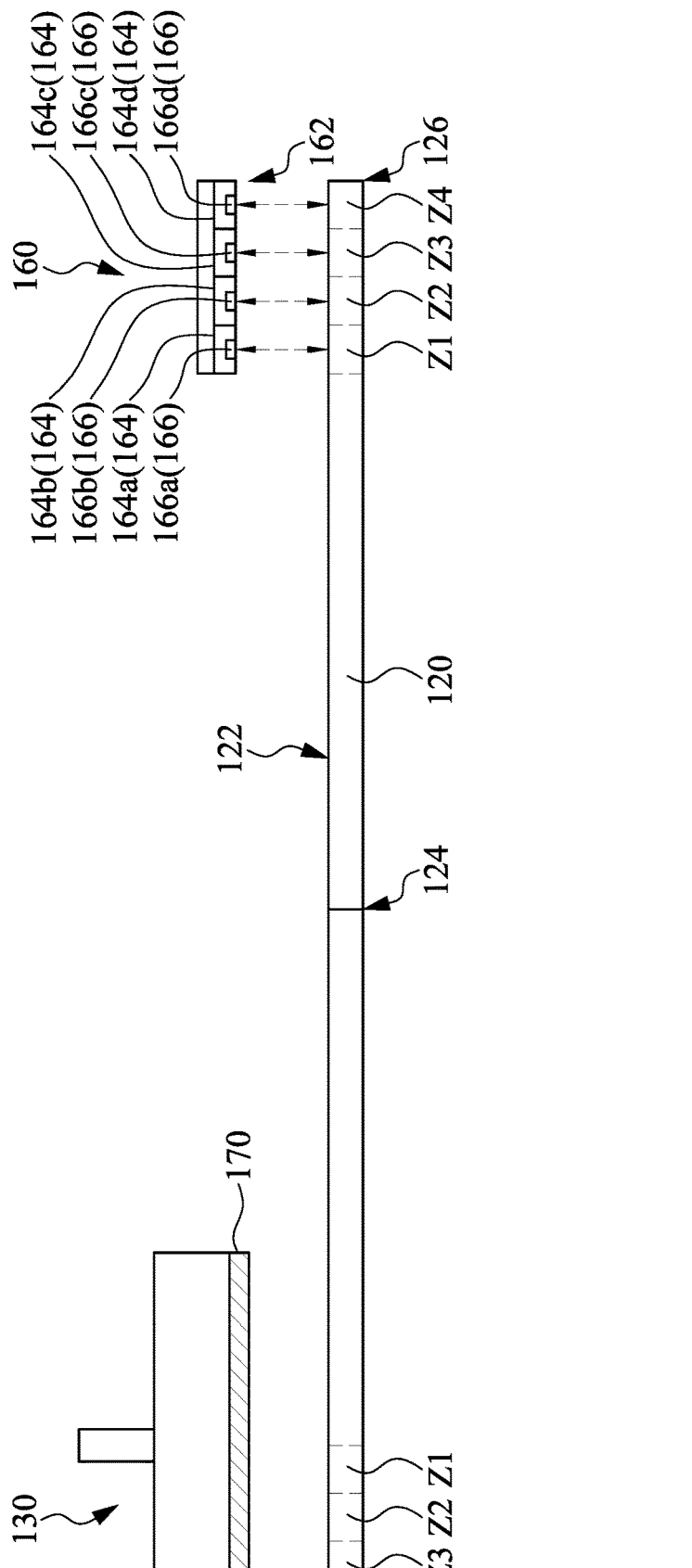
FIG. 8 is a cross-sectional view of the apparatus taken along line A-A'-A" of FIG. 2 according to aspects of one or more embodiments of the present disclosure.

FIG. 8 is a cross-sectional view of the apparatus 100 taken along the line A-A'-A" of FIG. 2 according to aspects of one or more embodiments of the present disclosure. As shown in FIG. 8, in some embodiments, the temperature control module 160 includes a first temperature controller 164a, a second temperature controller 164b, a third temperature controller 164c and a fourth temperature controller 164d. The first temperature controller 164a, the second temperature controller 164b, the third temperature controller 164c and the fourth temperature controller 164d may respectively be configured to control a first temperature of a first zone Z1 of the polishing pad 120, a second temperature of a second zone Z2 of the polishing pad 120, a third temperature of a third zone Z3 of the polishing pad 120, and a fourth temperature of a fourth zone Z4 of the polishing pad 120. Additionally, the temperature control module 160 includes a first temperature sensor 166a, a second temperature sensor 166b, a third temperature sensor 166c and a fourth temperature sensor 166d. The first temperature sensor 166a, the second temperature sensor 166b, the third temperature sensor 166c and the fourth temperature sensor 166d may respectively be configured to detect the first temperature of the first zone Z1, the second temperature of the second zone Z2, the third temperature of the third zone Z3 and the fourth temperature of the fourth zone Z4.

Figure 9:
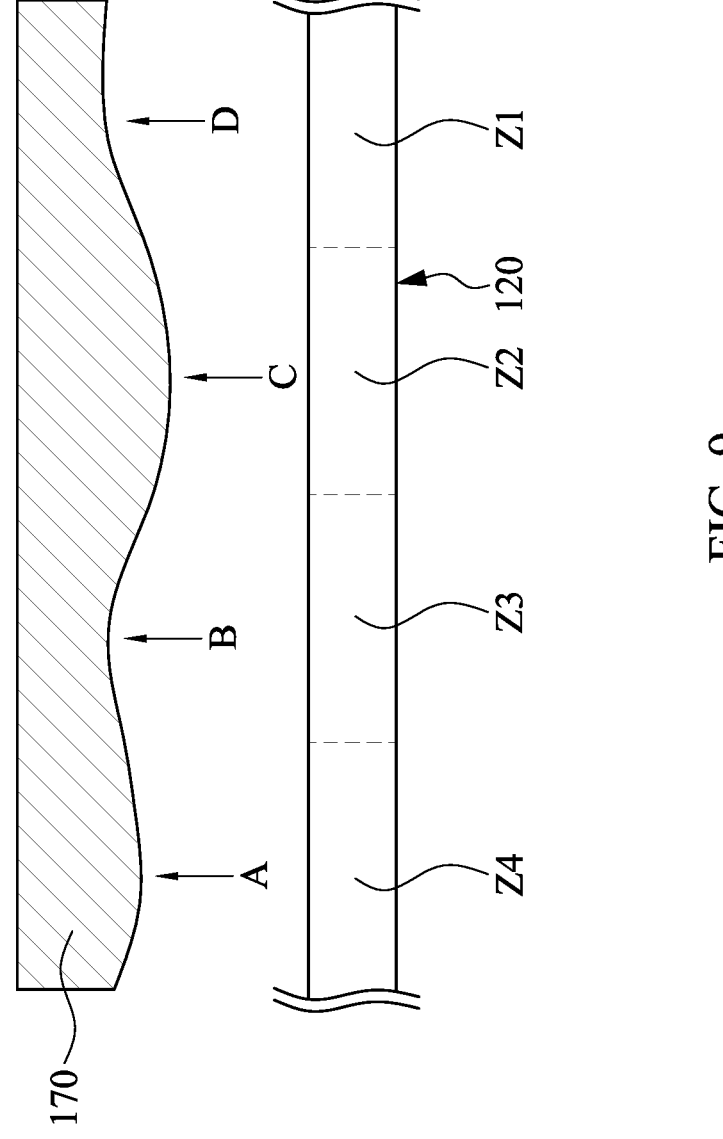
FIG. 9 is a cross-sectional view showing a method for using the apparatus according to aspects of one or more embodiments of the present disclosure.

In some embodiments, a top surface topography of the substrate 170 has multiple areas of unequal elevation, troughs, trenches and other similar types of surface irregularities. FIG. 9 is a cross-sectional view showing a method for using the apparatus 100, according to aspects of one or more embodiments of the present disclosure. FIG. 9 shows an enlarged view of a surface of the substrate 170 to be polished. The surface has an uneven surface topography having a protrusion A, a recess B, a protrusion C and a recess D. A temperature distribution of the polishing pad 120 is altered according to a topography information of the substrate 170 to be processed. A first temperature of the first zone Z1 and a third temperature of the third zone Z3 may be respectively decreased to lower the number of removal events at the recess D and at the recess B. Depending on the number of removal events required, the first temperature may be different from the third temperature. Alternatively, the second temperature of the second zone Z2 and the fourth temperature of the fourth zone Z4 may be respectively increased to raise a number of removal events at the protrusion C and at the protrusion A. Depending on the number of removal events required, the second temperature may be different from the fourth temperature.

By integrating the temperature control module 160 in the CMP apparatus 100 as described above, a temperature distribution of the polishing pad 120 may be more accurately controlled. With the control of the temperature distribution of the polishing pad 120, a surface profile of the substrate 170 may be improved and a uniformly polished surface may be obtained.

Figure 10:
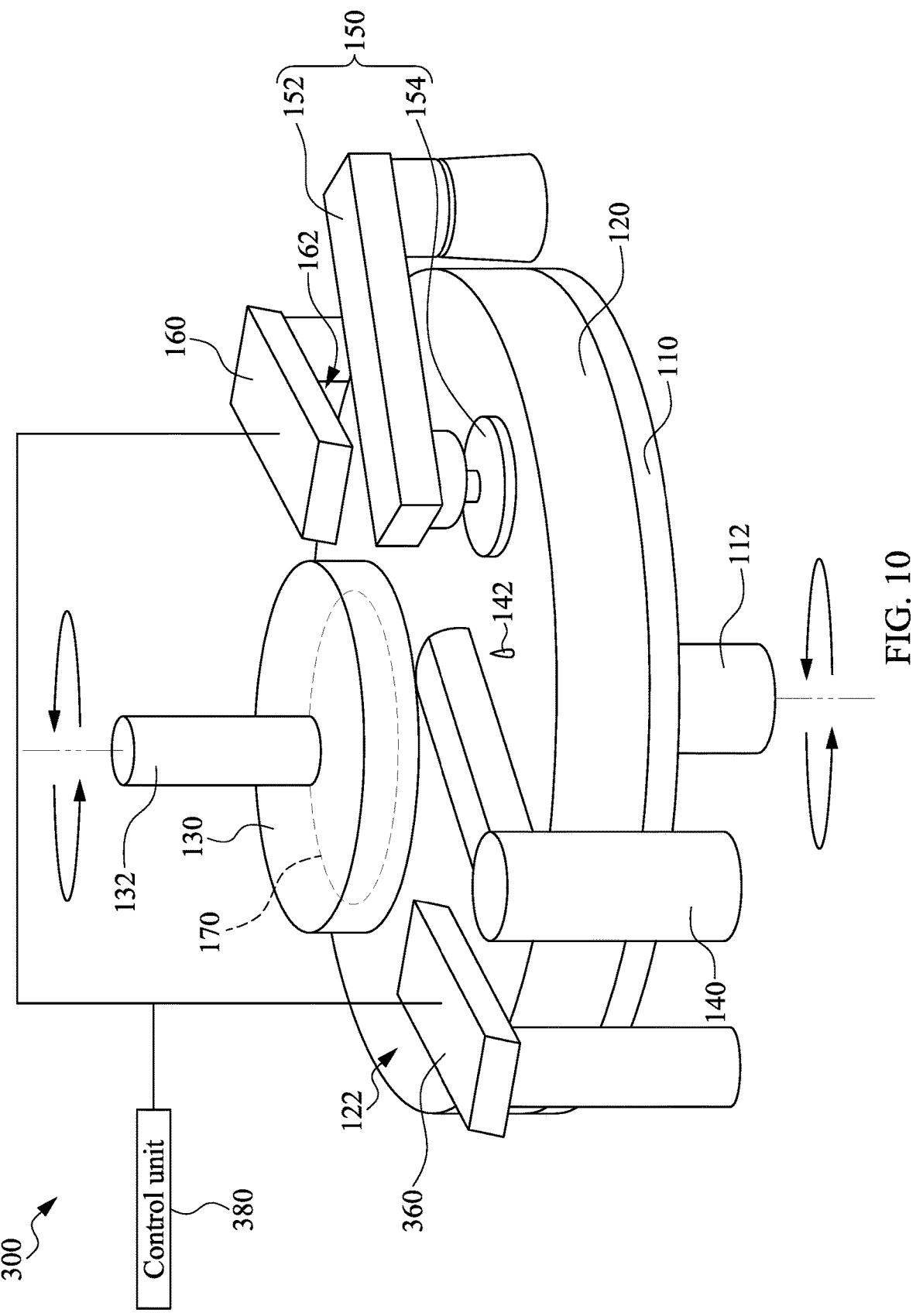
FIG. 10 is a schematic view of an apparatus for manufacturing a semiconductor structure according to aspects of one or more embodiments of the present disclosure.

Referring to FIG. 10, FIG. 10 is a schematic view of an apparatus 300 for manufacturing a semiconductor structure according to aspects of one or more embodiments of the present disclosure. In some embodiments, the apparatus 300 includes a pedestal 110, a polishing pad 120, a polishing head 130, a slurry introduction device 140, a pad conditioner 150, and one or more temperature control modules 160 and 360. In some embodiments, addition of the temperature control module 360 may facilitate a heating process or a cooling process such that the polishing pad 120 may achieve a desired temperature distribution in a shorter time. Positions of the temperature control modules 160 and 360 may be altered according to different implementations. As shown in FIG. 10, in some embodiments, the temperature control module 160 is arranged between the polishing head 130 and the pad conditioner 150, while the temperature control module 360 is arranged between the slurry introduction device 140 and the pad conditioner 150. In some embodiments, the temperature control module 360 may include one or more temperature controllers that are configured to control same regions of the polishing pad 120 as temperature controllers 164 of the temperature control module 160. For example, a temperature controller of the temperature control module 360 is configured to control a temperature of a first zone Z1 of the polishing pad 120, while another temperature controller of the temperature control module 360 is configured to control a temperature of a second zone Z2 of the polishing pad 120. In some alternative embodiments, the temperature controllers of the temperature control module 360 are configured to control temperatures of regions of the polishing pad 120 that are different from regions of the polishing pad 120 where temperatures are controlled by the temperature controllers 164 of the temperature control module 160. In some embodiments, the temperature control modules 160 and 360 are together connected to a control unit 380. The control unit 380 may adjust temperatures of the respective temperature control modules 160 and 360 to achieve a desirable temperature distribution of the polishing pad 120.

Figure 11:
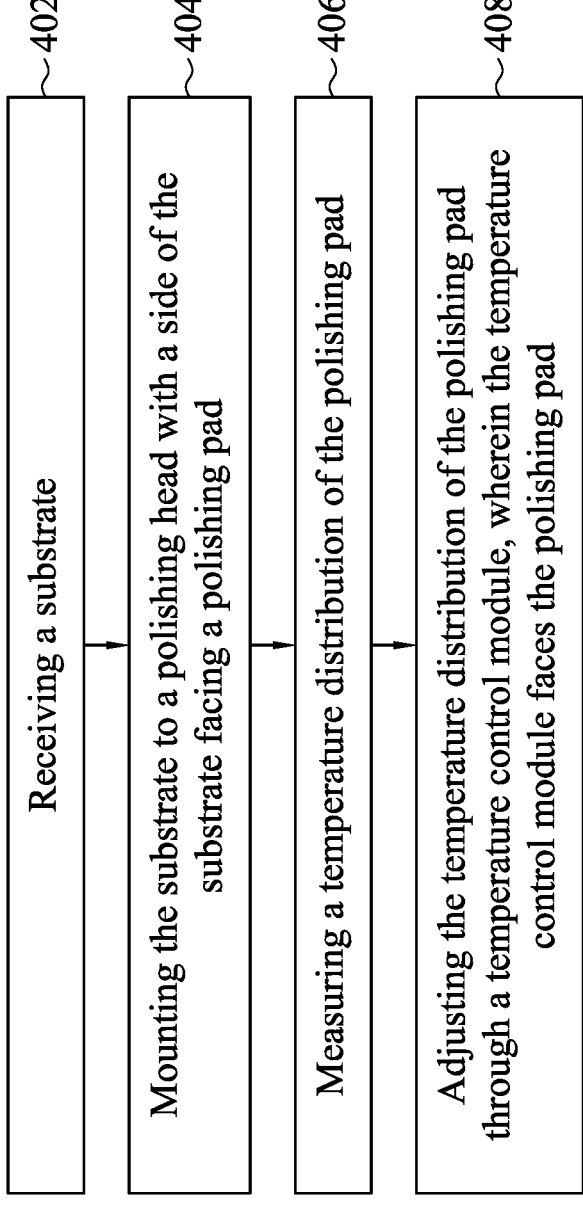
FIG. 11 is a flowchart representing a method for forming a semiconductor structure according to aspects of one or more embodiments of the present disclosure.
Figure 11:
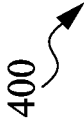

FIG. 11 is a flowchart representing a method 400 for forming a semiconductor structure according to aspects of one or more embodiments of the present disclosure. The method 400 for forming the semiconductor structure includes an operation 402, in which a substrate 170 is received. The method 400 further includes an operation 404 in which the substrate 170 is mounted on a polishing head 130 with a side of the substrate 170 facing a polishing pad 120. The method 400 further includes an operation 406, in which a temperature distribution of the polishing pad 120 is measured. The method 400 further includes an operation 408, in which the temperature distribution of the polishing pad 120 is adjusted through a temperature control module 160. In some embodiments, the temperature control module 160 faces the polishing pad 120. In some embodiments, prior to or after the measurement of the temperature distribution of the polishing pad 120, a surface profile of the substrate 170 is measured. In some embodiments, after the measurement of the surface profile of the substrate 170, the surface profile of the substrate 170 is analyzed. In some embodiments, the temperature distribution of the polishing pad 120 is adjusted in response to the surface profile of the substrate 170.

The method is described for a purpose of illustrating concepts of the present disclosure and the description is not intended to limit the present disclosure beyond what is explicitly recited in the claims. Additional operations can be provided before, during, and after the method described above and illustrated in FIG. 11, and some operations described can be replaced, eliminated, or rearranged for additional embodiments of the method.

Figure 12:
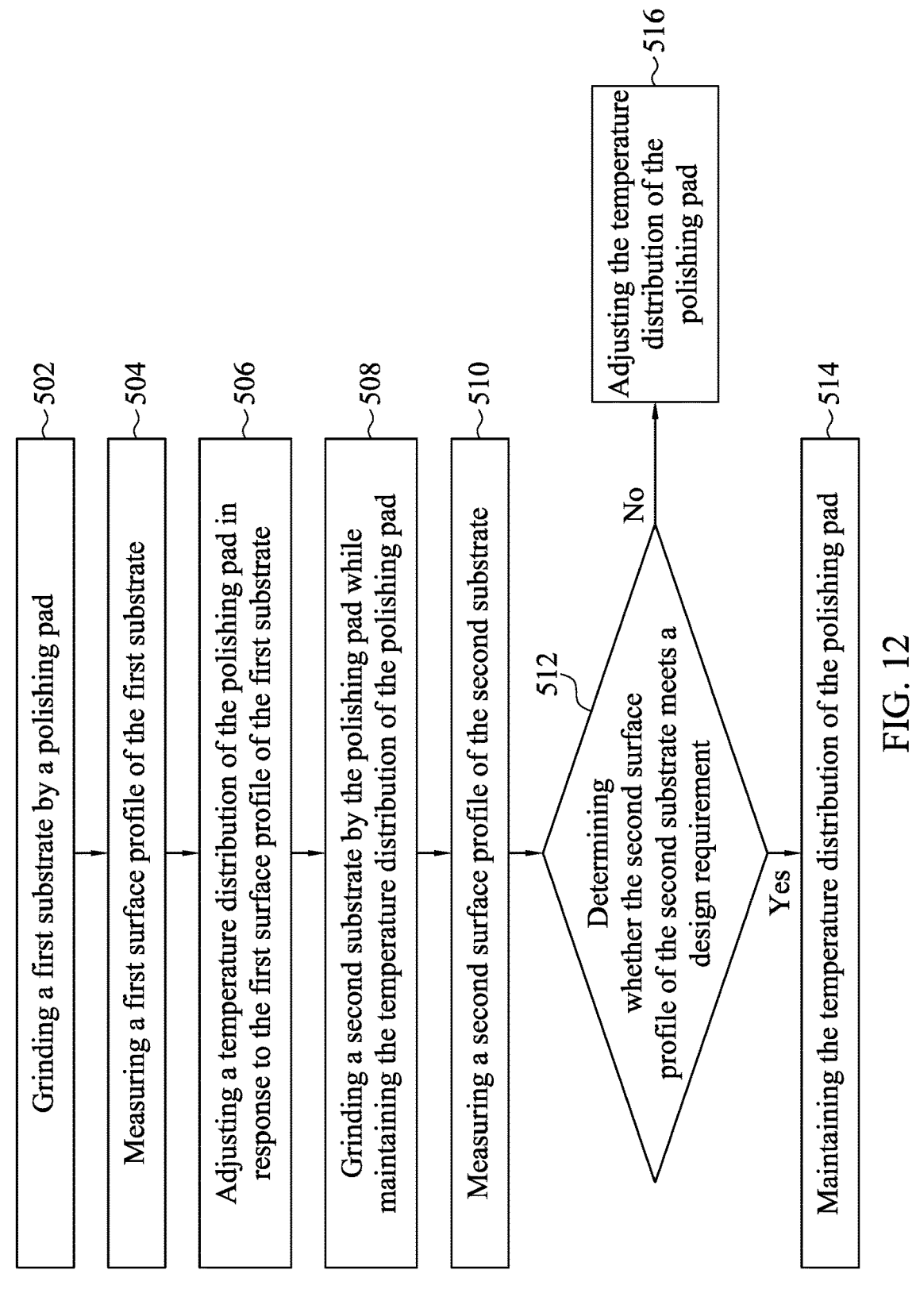
FIG. 12 is a flowchart representing a method for forming a semiconductor structure according to aspects of one or more embodiments of the present disclosure.

FIG. 12 is a flowchart representing a method 500 for forming one or more semiconductor structures according to aspects of one or more embodiments of the present disclosure. The method 500 includes an operation 502, in which a first substrate 170 is ground by (or polished by) a polishing pad 120, The method 500 further includes an operation 504, in which a first surface profile of the first substrate 170 is measured. The method 500 further includes an operation 506, in which a temperature distribution of the polishing pad 120 is adjusted in response to the first surface profile of the first substrate 170. In some embodiments, the first surface profile of the first substrate 170 is a thickness profile of the first substrate 170. In some embodiments, data of the thickness profile of the first substrate 170 is collected. Alternatively or additionally, the data of the thickness profile of the first substrate 170 is analyzed in a computing module. The computing module may include a pattern recognition module. In some embodiments, the pattern recognition module may include mathematical operations, machine learning, data mining and/or a neural network. In some embodiments, the temperature distribution of the polishing pad 120 is calculated and/or tuned according to an analyzed result of the first substrate 170. In some embodiments, the calculated result of the temperature distribution of the polishing pad 120 is transferred to a temperature control module 160.

The method 500 further includes an operation 508, in which a second substrate 170 another substrate 170) is ground by the polishing pad 120 while maintaining the temperature distribution of the polishing pad 120. In some embodiments, the method 500 further includes an operation 510, in which a second surface profile of the second substrate 170 is measured. In some embodiments, data of a thickness profile of the second substrate 170 is collected. In some embodiments, the method 500 further includes an operation 512, in which it is determined whether the second surface profile of the second substrate 170 meets a design requirement. In some embodiments, if the second surface profile of the second substrate meets the design requirement, the method 500 proceeds to an operation 514, in which the temperature distribution of the polishing pad 120 is maintained. Thereafter, in some embodiments, the method 500 further includes grinding of a third substrate 170 (i.e., another substrate 170) by the polishing pad 120 while maintaining the temperature distribution of the polishing pad 120. In some embodiments, if the second surface profile of the second substrate does not meet the design requirement, the method 500 proceeds to an operation 516, in which the temperature distribution of the polishing pad 120 is adjusted. Thereafter, in some embodiments, the method 500 further includes grinding of the third substrate 170 by the polishing pad 120 while employing the adjusted temperature distribution of the polishing pad 120.

The method is described for a purpose of illustrating concepts of the present disclosure and the description is not intended to limit the present disclosure beyond what is explicitly recited in the claims. Additional operations can be provided before, during, and after the method described above and illustrated in FIG. 12, and some operations described can be replaced, eliminated, or rearranged for additional embodiments of the method.

The present disclosure provides embodiments of methods for manufacturing a semiconductor structure that provide one or more improvements over existing approaches. By employing a temperature control module 160 in the methods as described above, a temperature distribution of a polishing pad 120 may be controlled and adjustable in response to surface profiles of different substrates 170, With real-time control of the temperature distribution of the polishing pad 120, a capacity of the polishing pad 120 may be enhanced. Accordingly, a lifetime of the polishing pad 120 may be extended.

The present disclosure provides embodiments of an apparatus and methods for manufacturing a semiconductor structure. By integrating a temperature control module in a CMP apparatus as described above, a temperature distribution of a polishing pad may be controlled. With the control of the temperature distribution of the polishing pad, a surface profile of a substrate may be improved and a uniformly polished surface may be obtained. Furthermore, with real-time control of the temperature distribution of the polishing pad, different substrates may have uniformly polished surfaces. Additionally, a capacity of the polishing pad may be enhanced through the control of the temperature distribution of the polishing pad, and a lifetime of the polishing pad may be extended.

In accordance with some embodiments of the present disclosure, an apparatus for manufacturing a semiconductor structure is provided. The apparatus includes a pedestal, a polishing pad, a polishing head and a temperature control module. The pedestal accommodates the polishing pad. The polishing head mounts a substrate against the polishing pad. The temperature control module faces the polishing pad. The temperature control module includes a first temperature controller and a second temperature controller. The first temperature controller is configured to control a first temperature of a first zone of the polishing pad. The second temperature controller is configured to control a second temperature of a second zone of the polishing pad.

In accordance with some embodiments of the present disclosure, a method for forming a semiconductor structure is provided. The method includes the following operations. A substrate is received. The substrate is mounted to a polishing head with a side of the substrate facing a polishing pad. A temperature distribution of the polishing pad is measured. The temperature distribution of the polishing pad is adjusted through a temperature control module. The temperature control module faces the polishing pad. The temperature control module includes a first temperature controller and a second temperature controller. The first temperature controller is configured to control a first temperature of a first zone of the polishing pad. The second temperature controller is configured to control a second temperature of a second zone of the polishing pad.

In accordance with some embodiments of the present disclosure, a method for forming a semiconductor structure is provided. The method includes the following operations. A first substrate is ground by a polishing pad. A first surface profile of the first substrate is measured. A temperature distribution of the polishing pad is adjusted in response to the first surface profile of the first substrate. A second substrate is ground by the polishing pad while maintaining the temperature distribution of the polishing pad.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

receiving a substrate;

mounting the substrate on a polishing head with a side of the substrate facing a polishing pad;

measuring a temperature distribution of the polishing pad; and adjusting the temperature distribution of the polishing pad through a temperature control module, wherein the temperature control module faces the polishing pad, and the temperature control module comprises:

a first temperature controller, configured to adjust a first temperature of a first zone of the polishing pad by heating or cooling the polishing pad in a non-contact manner;

a second temperature controller, configured to adjust a second temperature of a second zone of the polishing pad by heating or cooling the polishing pad in a non-contact manner;

a first temperature sensor, configured to detect the first temperature of the first zone of the polishing pad, wherein a vertical projection of the first temperature controller on the polishing pad encompasses a vertical projection of the first temperature sensor on the polishing pad; and a second temperature sensor, configured to detect the second temperature of the second zone of the polishing pad, wherein a vertical projection of the second temperature controller on the polishing pad encompasses a vertical projection of the second temperature sensor on the polishing pad.

2. The method according to claim 1, wherein the first zone corresponds to a center region of the polishing pad, and the second zone corresponds to a peripheral region of the polishing pad.

3. The method according to claim 1, wherein the adjusting of the temperature distribution of the polishing pad includes increasing the first temperature of the first zone and the second temperature of the second zone by a heating element.

4. The method according to claim 1, wherein the adjusting of the temperature distribution of the polishing pad includes decreasing the first temperature of the first zone and the second temperature of the second zone by a cooling element.

5. The method according to claim 1, further comprising: measuring a surface profile of the substrate.

6. The method according to claim 5, further comprising: analyzing the surface profile of the substrate.

7. The method according to claim 6, further comprising: adjusting the temperature distribution of the polishing pad in response to the surface profile of the substrate.

8. A method for forming a semiconductor structure, comprising:

grinding of a first substrate by a polishing pad;

measuring a first surface profile of the first substrate;

adjusting a temperature distribution of the polishing pad in response to the first surface profile of the first substrate by heating or cooling the polishing pad in a non-contact manner, wherein the temperature distribution is obtained by temperature sensors positioned adjacent to respective temperature controllers, wherein the temperature sensors are configured to detect temperatures of different zones of the polishing pad, and a vertical projection of the temperature controllers on the polishing pad encompasses a vertical projection of the respective temperature sensors on the polishing pad; and grinding of a second substrate by the polishing pad while controlling the temperature distribution of the polishing pad based on the adjusted temperature distribution.

9. The method according to claim 8, further comprising:

measuring a second surface profile of the second substrate.

10. The method according to claim 9, further comprising:

maintaining the temperature distribution of the polishing pad if the second surface profile of the second substrate meets a design requirement.

11. The method according to claim 9, further comprising:

adjusting the temperature distribution of the polishing pad if the second surface profile of the second substrate does not meet a design requirement.

12. A method for forming a semiconductor structure, comprising:

polishing a substrate by a polishing pad;

measuring a temperature distribution of the polishing pad; and adjusting the temperature distribution of the polishing pad through a temperature control module in response to a surface profile of the substrate, wherein the temperature control module comprises temperature controllers and temperature sensors adjacent to respective temperature controllers, each of the temperature controllers respectively configured to adjust a temperature of one of zones of the polishing pad by heating or cooling the polishing pad in a non-contact manner, and each of the temperature sensors respectively configured to detect the temperature of a corresponding zone of the polishing pad, wherein a vertical projection of the temperature controllers on the polishing pad encompasses a vertical projection of the respective temperature sensors on the polishing pad.

13. The method according to claim 12, further comprising:

measuring the surface profile of the substrate by a measurement device.

14. The method according to claim 13, further comprising: analyzing a thickness distribution of the substrate as the surface profile of the substrate.

15. The method according to claim 12, wherein the temperature controllers comprise:

a first temperature controller, configured to adjust a first temperature of a first zone of the polishing pad; and a second temperature controller, configured to adjust a second temperature of a second zone of the polishing pad.

16. The method according to claim 15, wherein the first zone is located near a center of the polishing pad, and the second zone is located near a perimeter of the polishing pad.

17. The method according to claim 15, wherein the temperature control module comprises:

a third temperature controller, configured to control a third temperature of a third zone of the polishing pad, wherein the third zone is between the first zone and the second zone.

18. The method according to claim 12, wherein the measuring the temperature distribution of the polishing pad includes detecting the temperatures of the zones of the polishing pad by the respective temperature sensors positioned above the corresponding zones of the polishing pad.

19. The method according to claim 18, wherein the temperature sensors of the temperature control module comprise:

a first temperature sensor, configured to detect a first temperature of a first zone of the polishing pad; and a second temperature sensor, configured to detect a second temperature of a second zone of the polishing pad.

20. The method according to claim 18, wherein the temperature sensors of the temperature control module comprise:

a third temperature sensor, configured to detect a third temperature of a third zone of the polishing pad, wherein the third zone is between the first zone and the second zone.

\* \* \* \* \*